United States Patent
Ikada et al.

(10) Patent No.: US 6,516,503 B1
(45) Date of Patent: Feb. 11, 2003

(54) METHOD OF MAKING SURFACE ACOUSTIC WAVE DEVICE

(75) Inventors: Katsuhiro Ikada, Ishikawa-ken (JP); Kenji Sakaguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/574,794

(22) Filed: May 19, 2000

(30) Foreign Application Priority Data

May 26, 1999 (JP) .......................................... 11-146800

(51) Int. Cl.[7] .............................................. H04R 17/00
(52) U.S. Cl. ......................... 29/25.35; 29/600; 29/593; 310/313 B; 310/365; 216/99; 216/79
(58) Field of Search .......................... 29/594, 595, 609, 29/600, 601, 25.35, 593; 310/313 B, 365, 366; 216/13, 80, 99, 79

(56) References Cited

U.S. PATENT DOCUMENTS

| | | | | |
|---|---|---|---|---|
| 4,810,920 A | * | 3/1989 | Yamamoto | 310/313 D |
| 4,870,313 A | * | 9/1989 | Hirama et al. | 310/320 |
| 5,221,870 A | * | 6/1993 | Nakahata et al. | 310/313 A |
| 5,390,401 A | * | 2/1995 | Shikata et al. | 29/25.35 |
| 5,426,340 A | | 6/1995 | Higaki et al. | |
| 5,432,393 A | | 7/1995 | Davenport | |
| 5,996,199 A | * | 12/1999 | Ichikawa et al. | 29/25.35 |
| 6,046,656 A | * | 4/2000 | Mishima | 333/141 |
| 6,127,769 A | * | 10/2000 | Kodata et al. | 310/313 B |
| 6,185,801 B1 | * | 2/2001 | Kadota et al. | 29/25.35 |

FOREIGN PATENT DOCUMENTS

| | | |
|---|---|---|
| JP | 3-26013 | 2/1991 |
| JP | 10-190390 | 7/1998 |

* cited by examiner

Primary Examiner—Peter Vo
Assistant Examiner—Tai Nguyen
(74) Attorney, Agent, or Firm—Keating & Bennett, LLP

(57) ABSTRACT

A method of making surface acoustic wave device includes a piezoelectric substrate, a first surface acoustic wave element having at least one interdigital transducer on the piezoelectric substrate, a second surface acoustic wave element having at least one interdigital transducer which is provided on the piezoelectric substrate. The at least one interdigital transducer of the second surface acoustic wave element has a thickness that is different from the interdigital transducer of the first surface acoustic wave element, and the second surface acoustic wave element has a frequency characteristic that is different from that of the first surface acoustic wave element. An insulating film is applied to the first and second surface acoustic wave elements. A thickness of the insulating film at a region on the first surface acoustic wave element is different from the thickness of a region on the second surface acoustic wave.

15 Claims, 5 Drawing Sheets

FIG. 2
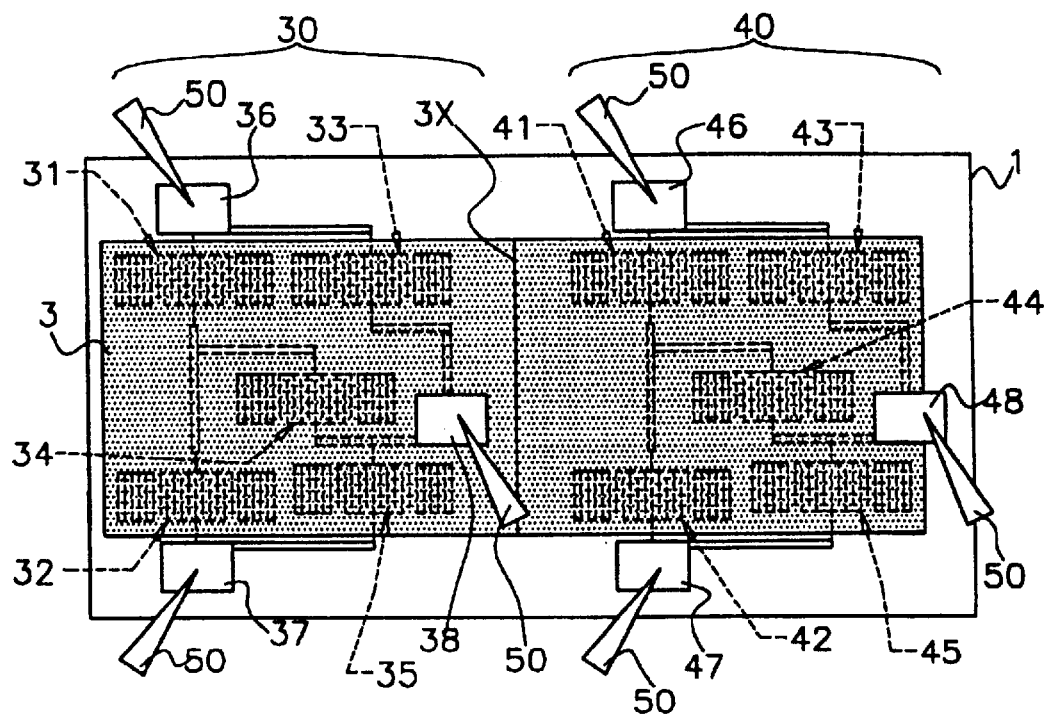
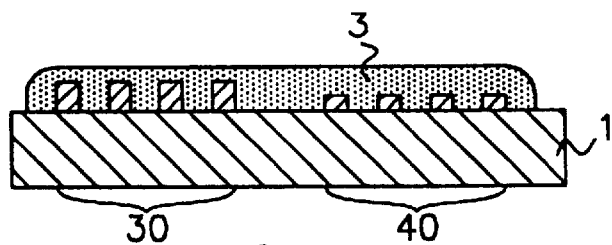
FIG. 3A
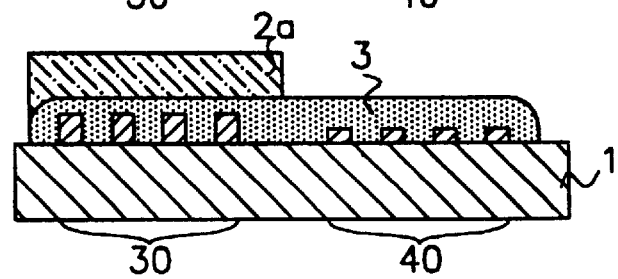
FIG. 3B
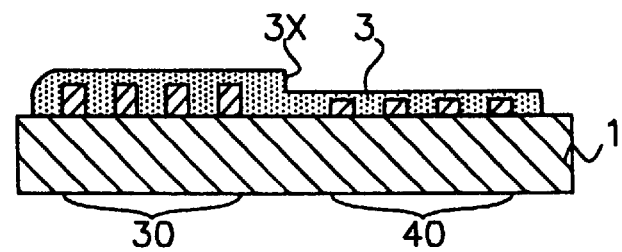
FIG. 3C

METHOD OF MAKING SURFACE ACOUSTIC WAVE DEVICE

BACKGROUND OF THE INVENTION

1. Field of the Invention

The present invention relates to a surface acoustic wave device having several types of IDTs on a piezoelectric substrate, and a method of producing such a surface acoustic wave device.

2. Description of the Prior Art

In recent years, to increase the utility of mobile communication devices, research has been done on a multi-band corresponding portable telephone having at least two communication systems. In addition, for portable telephones, a higher transmission frequency has been increasingly used.

Accordingly, with respect to a terminal which can use both of the communication systems for a 800 MHz band cellular phone and an at least 1.5 GHz band cellular phone, it is necessary to provide an RF band-pass filter for each of the two different frequencies.

The reduction of the number of components required for such a terminal, to reduce size and weight, has a limitation. Accordingly, one component having two filter functions is desirable.

For this reason, it has been proposed that several filter functions be provided on one piezoelectric substrate. A surface acoustic wave device has been proposed which has two types of electrodes such as IDTs or other suitable electrodes, having different film-thicknesses formed on one piezoelectric substrate so that the device can operate in two different frequencies.

A method of producing such a surface acoustic wave device has been proposed by Japanese Unexamined Patent Application Publication No. 10-190390, for example. Hereinafter, the method of producing a surface acoustic wave device will be described with reference to FIGS. 6A to 6E.

First, a conductive film 104a having a predetermined film thickness is formed on a piezoelectric substrate 101. On the piezoelectric substrate 101 having the conductive film 104a, a resist is provided. Next, the resist is exposed using a mask having a shielding portion corresponding to the pattern of the IDT of a first surface acoustic wave element, and then the resist is developed. Accordingly, the exposed portion of the resist is removed. As a result, the unexposed portion 102a of the resist corresponding to the IDT pattern of the first surface acoustic wave element remains.

The conductive film 104a is removed by etching, except for the portion of the conductive film corresponding to the resist 102a. Accordingly, the IDT 111 of the first surface acoustic wave element 110 is produced as shown in FIG. 6B.

Next, a resist is provided on the piezoelectric substrate 101 having the IDT 111 of the first surface acoustic wave element, and exposed using a mask which includes an opening portion corresponding to the IDT of a second surface acoustic wave element, and then the resist is developed whereby the exposed portion of the resist is removed. As a result, the resist 102b having an opening portion corresponding to the IDT of the second surface acoustic wave element is produced, as shown in FIG. 6C.

Next, as shown in FIG. 6D, a conductive film 104b having a smaller film-thickness than that of the IDT 111 of the first surface acoustic wave element 110 is disposed on the piezoelectric substrate 101 having the resist 104b.

Finally, the resist 102b and the conductive film 104b disposed on the resist 102b are removed simultaneously. As shown in FIG. 6E, the IDT 121 of the second surface acoustic wave element 120, having a smaller thickness than the IDT 111 of the first surface acoustic wave element 110, is produced.

According to the above-described production method, the surface acoustic wave elements having different frequency characteristics are produced on the same piezoelectric substrate.

The surface acoustic wave device described above has a problem associated with the manufacturing method thereof. Specifically, when the film-thickness and/or the electrode finger width of the IDT deviate from their predetermined ranges so that desired frequency characteristics are not obtained after the formation of the IDT of the second surface acoustic wave element, the surface acoustic device is defective even though the previously produced frequency characteristic of the first surface acoustic wave element have been obtained.

That is, the first and second surface acoustic wave elements are formed on the same piezoelectric substrate to define a composite device. Accordingly, if only one of the surface acoustic wave elements has a frequency characteristic that deviates from a desired value, the device is rendered defective. Thus, the defective ratio is considerably higher than the defective ratios arising from surface acoustic wave devices wherein the first and second surface acoustic wave elements are formed on separate piezoelectric substrates.

Further, when a resist pattern is used to produce an IDT, the resist pattern is generally heated to enhance the adhesion thereof to a piezoelectric substrate and plasma-resistance. When this process is applied to the method of producing a surface acoustic wave device in which a plurality of surface acoustic wave elements having different frequency characteristics are included, a problem arises.

More specifically, when the resist pattern used to produce an IDT of a second surface acoustic wave element is heated after formation of a first surface acoustic wave element, a potential difference between the electrode fingers of the IDT in the first surface acoustic wave element is generated due to the pyroelectric properties of the piezoelectric substrate. The potential difference is discharged and pyroelectric breakdown is possible. Even if the discharge is not large enough to cause the pyroelectric breakdown, the discharge could destroy or distort the resist pattern leading to a short-circuit of the IDT of the first surface acoustic wave element during the formation of the IDT of the second surface acoustic wave element.

SUMMARY OF THE INVENTION

To overcome the problems discussed above, the preferred embodiments of the present invention provide a surface acoustic wave device in which surface acoustic wave elements with different frequency characteristics are provided on a piezoelectric substrate which has a greatly reduced rejection ratio and a greatly increased reliability, and a method of producing such a surface acoustic wave device.

A preferred embodiment of the surface acoustic wave device includes a piezoelectric substrate, a first surface acoustic wave element including at least one interdigital transducer on the piezoelectric substrate, and a second surface acoustic wave element including at least one interdigital transducer which is provided on the piezoelectric substrate and has a thickness that is different from that of the interdigital transducer of the first surface acoustic wave element. The second surface acoustic wave element has a frequency characteristic that is different from that of the first surface acoustic wave element. An insulating film is disposed on the first and second surface acoustic wave elements, and the thickness of the insulating film in the region of the first surface acoustic wave element is different from the thickness of the insulating film in the region of the second surface acoustic wave element.

With this unique structure and arrangement, the frequency characteristics of the two different surface acoustic wave elements are effectively adjusted.

Another preferred embodiment of the present invention provides a method of producing a surface acoustic wave device in which first and second surface acoustic wave elements are provided on a piezoelectric substrate, the method including the steps of forming an interdigital transducer of the first surface acoustic wave element on the piezoelectric substrate, the interdigital transducer having input-output terminals which are electrically connected by a short-circuiting electrode, providing a resist on the whole surface of the substrate where the interdigital transducer of the first surface acoustic wave element and the short-circuiting electrode are located, and heating the resist, removing the resist only on the area where the second surface acoustic wave element is to be located, forming a conductive film on the piezoelectric substrate, the conductive film having a thickness that is different from a thickness of the interdigital transducer of the first surface acoustic wave element, patterning the conductive film to produce an interdigital transducer of the second surface acoustic wave element by a lift-off method, cutting the short-circuiting electrode to electrically disconnect the input-output terminals of the interdigital transducer of the first surface acoustic wave element from the second surface acoustic wave element, forming an insulating film on the interdigital transducers of the first and second surface acoustic wave elements, and decreasing the thickness of the insulating film to adjust frequency characteristics of the first and second surface acoustic wave elements.

Accordingly, the IDT electrode of the first surface acoustic wave element is prevented from being short-circuited after the second surface acoustic wave element is lifted-off. In addition, the defective ratio of the composite element can be reduced by forming an $SiO_2$ film on the first and second surface acoustic wave elements.

The method of another preferred embodiment of the present invention may further include the steps of measuring the frequency characteristics of the first and second surface acoustic wave elements by wafer probing prior to the step of adjusting the frequency, wherein the step of decreasing the thickness of the insulating film is performed so that the thickness of the insulating film in a region of the interdigital transducer of the first surface acoustic wave element is different from the thickness at the region on the interdigital transducer of the second surface acoustic wave element.

Further, the insulating film produced by the insulating film forming step may have a predetermined thickness such that one of the first and second surface acoustic wave elements has desired frequency characteristics, and the step of decreasing the thickness of the insulating film is performed by etching only in the region of the other of the first and second surface acoustic wave elements.

Alternatively, the step of decreasing the thickness of the insulating film may include the steps of decreasing the thickness of the entire insulating film such that one of the first and second surface acoustic wave elements has desired frequency characteristics, measuring frequency characteristics of the other of the first and second surface acoustic wave elements to determine the desired thickness of the insulating film for the other of the first and second surface acoustic wave elements to produce the desired frequency characteristics, and decreasing the thickness of the insulating film only in the region of the other of the first and second surface acoustic wave elements to produce the desired frequency characteristics based on the desired thickness determined by the measuring step.

Accordingly, the frequency characteristics of the first and second surface acoustic wave elements can be effectively adjusted.

Other features, elements, characteristics and advantages of the present invention will become apparent from the detailed description of preferred embodiments of the present invention below with reference to the attached drawings.

BRIEF DESCRIPTION OF THE DRAWINGS

FIGS. 2 is a schematic plan view showing a surface acoustic wave device according to a second preferred embodiment of the present invention.

FIGS. 3A to 3C are schematic cross-sectional views showing a process for the surface acoustic wave device according to the second preferred embodiment of the present invention.

DETAILED DESCRIPTION OF PREFERRED EMBODIMENTS

The present invention will be understood from the following description of the preferred embodiments taken in conjunction with the accompanying drawings.

A method of producing a surface acoustic wave device according to a first preferred embodiment of the present invention will be described with reference to the drawings.

First, a conductive film is formed on the entire upper surface of a piezoelectric substrate. The thickness of the conductive film is preferably substantially equal to that of the IDT of a first surface acoustic wave element, reflectors, or other suitable elements. The conductive film is produced by depositing a conductive material such as Al or other suitable material using an appropriate method such as vapor depositing, sputtering, plating, or other suitable methods.

Next, a positive resist is formed on the entire surface of the conductive film. The resist is exposed through a mask having a shielding portion corresponding to the IDT of the first surface acoustic wave element, the reflectors, or other suitable elements. Subsequently, the exposed resist portion is removed, whereby the resist is patterned.

Thereafter, etching is performed using an etchant which can remove the conductive film without corroding the resist.

Figure 1A:
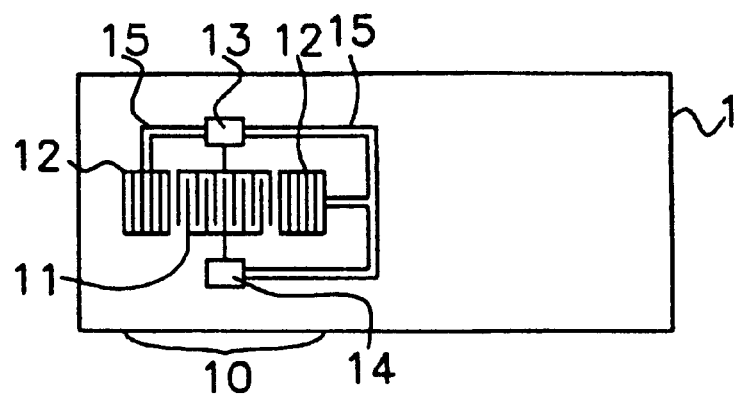
FIGS. 1A to 1D are schematic plan views showing the process of a surface acoustic wave device according to a first preferred embodiment of the present invention.

Thus, the IDT 11 of a one terminal pair resonator defining a first surface acoustic wave element 10, reflectors 12, input-output terminals 13 and 14, and short-circuiting electrodes 15 are produced. As seen in FIG. 1A, the short-circuiting electrodes 15 are positioned between the input-output terminals 13 and 14 and the reflectors 12. The etching may be wet type or dry type using plasma or other similar substances. Also, the electrodes may be formed by a lift-off method or other suitable methods.

It is noted that the first surface acoustic wave element 10 may be constructed to not include the reflectors 12. In this case, the short-circuiting electrode is positioned only between the input-output terminals 15.

Figure 1B:
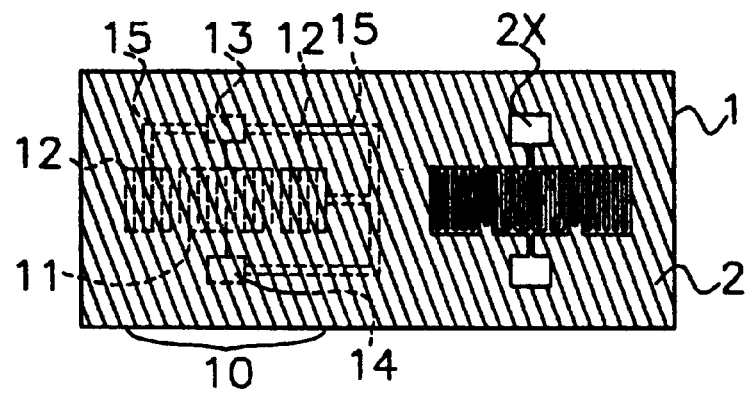

Next, a positive resist is formed on the entire surface of the piezoelectric substrate 1. Thereafter, on the portion of the piezoelectric substrate having the second surface acoustic wave element 20, a mask having an open patterning portion corresponding to the IDT, the reflectors, and other suitable elements is laminated to the resist, and exposed. The exposed resist part is removed, whereby a resist 2 with openings 2X, having a patterned shape is produced as shown in FIG. 1B. As shown in FIG. 1B, on the first surface acoustic wave element 10 portion, the IDT 11, the reflectors 12, the input-output terminals 13 and 14, and the short-circuiting electrodes 15 are protected by the resist 2.

At this stage, the resist 2 is heat-treated to enhance the adhesion and to improve the plasma resistance of the resist. During this heat-treatment, since the input-output terminals 13 and 14 and the reflectors 12 are short-circuited by the short-circuiting electrode 15, respectively, the potential differences in the respective portions are lost, so that the respective portions are at the same potentials. Therefore, no discharge occurs unless the IDT and the resist are broken.

A conductive film is produced with a film-thickness that is preferably substantially equal to that of the IDT of the second surface acoustic wave element. The thickness of the IDT of the second surface acoustic wave element is different from that of the first acoustic wave element. Thereafter, the conductive film formed on the resist 2 is removed together with the resist 2. Thereby, the IDT 21 of the second surface acoustic wave element 20, reflectors 22, and input-output terminals 23 and 24 is produced.

Figure 1C:
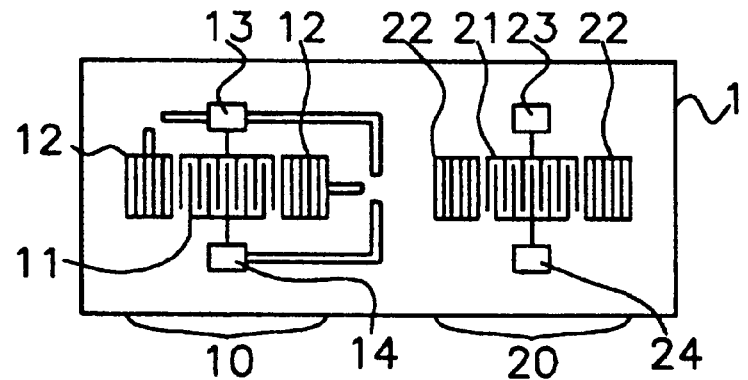

As shown in FIG. 1C, a portion of the short-circuiting electrode is cut. For example, the short-circuiting electrode may be cut by photolithography or etching using the resist, or other suitable method.

Figure 1D:
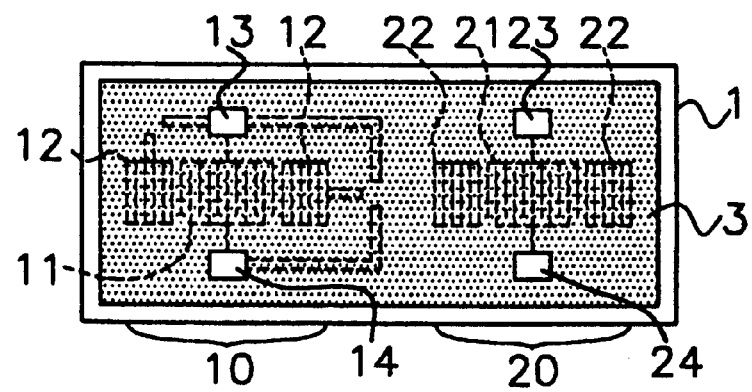

As shown in FIG. 1D, an insulating film 3 is positioned on the piezoelectric substrate 1. The insulating film 3 is preferably made of $SiO_2$, but can be made of other suitable materials, and is applied using RF magnetron sputtering or via another suitable film application process. To connect an external circuit, the insulating film 3 above the input-output terminals 13 and 14 of the first surface acoustic wave element 10, and the insulating film 3 and the input-output terminals 23 and 24 of the second surface acoustic wave element 20 are removed.

As described above, in this preferred embodiment, the first and second surface acoustic wave elements having different characteristics, which are produced by making the electrode film-thicknesses different, are formed on the piezoelectric substrate. More specifically, the IDT of the first surface acoustic wave element is formed, and simultaneously, the input-output terminals for the IDT and the reflectors are connected, respectively, by the short-circuiting electrodes. After the IDT of the second surface acoustic wave element is formed, the short-circuiting wire is cut. Therefore, the IDT of the first surface acoustic wave is prevented from being short-circuited during the formation of the second surface acoustic wave element. In addition, the frequency can be adjusted by applying the insulating $SiO_2$ film on the first and second surface acoustic wave elements. Accordingly, the number of defective composite surface acoustic wave devices is minimized.

A surface acoustic wave device according to a second preferred embodiment of the present invention and a method of producing the surface acoustic wave device of this preferred embodiment will be described with reference to the drawings. Similar portions to those of the first preferred embodiment are designated by the same reference numerals, and the detailed description is omitted to avoid repetition.

FIG. 2 shows the configuration of first and second surface acoustic wave elements 30 and 40 and wafer probing positions. The first surface acoustic wave element 30 is a ladder type filter including series arm resonators 31 and 32, and parallel arm resonators 33, 34, and 35. Similarly, the second surface acoustic wave element 40 is a ladder type filter including series arm resonators 41 and 42, and parallel arm resonators 43, 44, and 45.

An insulating film 3 preferably made of $SIO_2$ is applied to the first surface acoustic wave element 30 and the second surface wave element 40, except in the regions of the input-output terminals 36 to 38 of the first surface wave element 30 and the input-output terminals 46 to 48 of the second surface acoustic wave element 40. Further, the film-thicknesses of the insulating film 3 on the first surface acoustic wave element 30 and on the second surface acoustic wave element 40 differ, resulting in the formation of a step 3X.

As shown in FIG. 2, probes 50 are connected to the input-output terminals 36 to 38 of the first surface acoustic wave element 30 and the input-output terminals 46 to 48 of the second surface acoustic wave element 40 to perform wafer-probing.

FIG. 3A is a schematic cross-sectional view showing the state in which the insulating film 3 is evenly formed. The frequency characteristic of the first surface acoustic wave element 30 is adjusted to achieve a desired value. Further, the frequency characteristic of the second surface acoustic wave element 40 is higher than a desired frequency before the insulating film 3 is applied, and is lower than the desired frequency in the state of FIG. 3A.

The frequency characteristic of the second surface acoustic wave element is measured by probe 50 via wafer probing. The adjustment amount of the frequency characteristic is determined based on the measurements of the probe. In the following process, the frequency characteristic of the second surface acoustic wave element is adjusted, and the step 3X of the insulating film shown in FIG. 2 is formed.

The process of adjusting the frequency characteristic of the second surface acoustic wave element will be described with reference to FIG. 3.

First, a positive resist is formed on the whole surface of the insulating film 3. The resist is exposed through a mask having a shielding portion corresponding to the first surface acoustic wave element 30. Thereafter, the exposed resist portion is removed. As a result, the patterned resist 2a shown in FIG. 3B is produced.

Thereafter, etching is performed using an etchant that is capable of removing the insulating film 3, while not corroding the resist 2a. Whereby a step 3X is produced on the insulating film 3 as shown in FIG. 3C. The etching may be wet type or dry type using plasma or other suitable methods.

Figure 4:
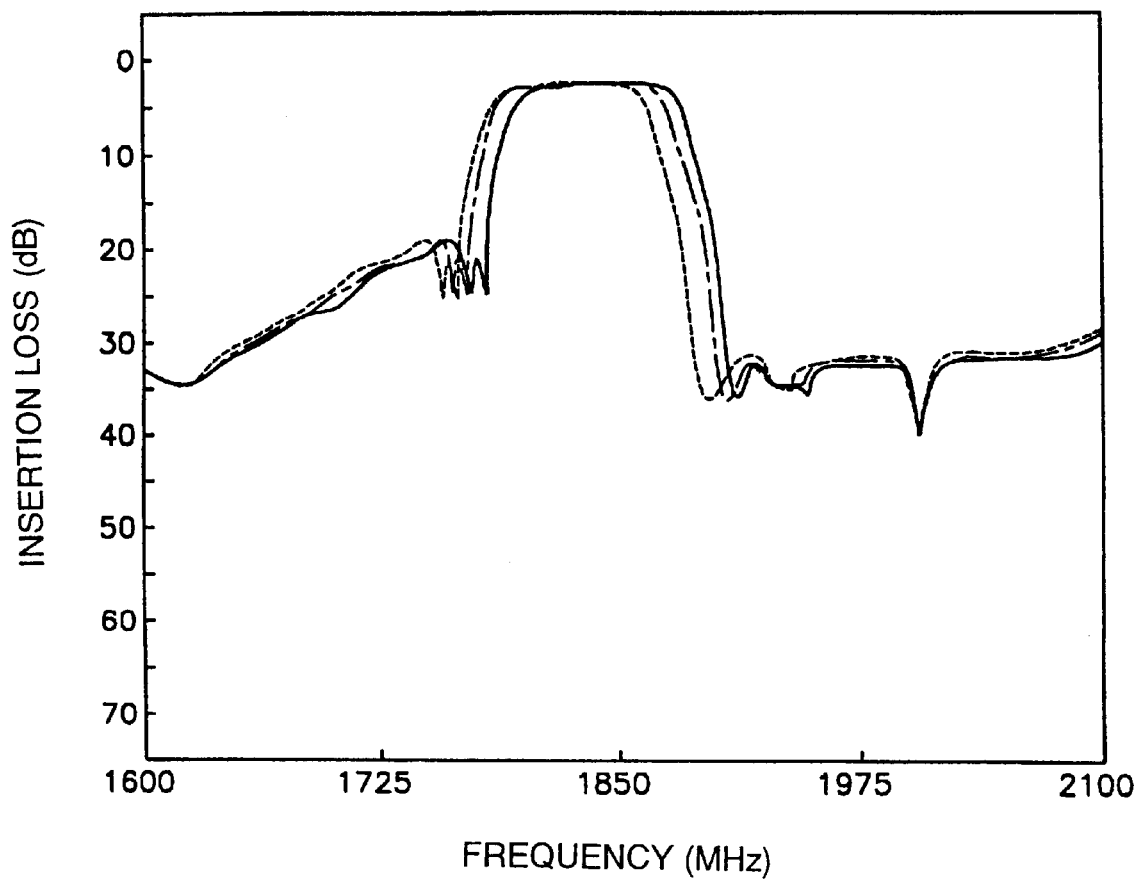
FIG. 4 is a characteristic graph showing changes in frequency, caused by the insulating film according to a preferred embodiment of the present invention.

FIG. 4 shows the changes in frequency characteristic of the second surface acoustic wave element 40. In FIG. 4, the solid line represents the characteristic of the element 40 having no insulating film, the broken line represents the characteristic of the element 40 with an approximately 29 nm insulating film applied, and the dashed line represents the characteristic of the element 40 where plasma etching is performed to reduce the insulating thickness to about 13 nm. As seen in FIG. 4, the frequency characteristic is adjusted by etching the thickness of the insulating film made of $SiO_2$.

As described above, according to this preferred embodiment, the number of defective composite elements is minimized by forming the $SiO_2$ film on the first and second surface acoustic wave elements. Specifically, the different frequencies of the two surface acoustic wave elements can be effectively adjusted by forming $SiO_2$ films of different thicknesses on the first and second surface acoustic wave elements. Thus, the number of defective composite elements is greatly reduced.

A method of producing a surface acoustic wave device according to a third preferred embodiment of the present invention will be described. Similar portions to those of the above-described first and second preferred embodiments are designated by the same reference numerals, and the detailed description is omitted to avoid repetition.

This preferred embodiment provides a method in which the film-thicknesses of the insulating film on the first and second surface acoustic wave elements are made different from each other.

Figure 5A:
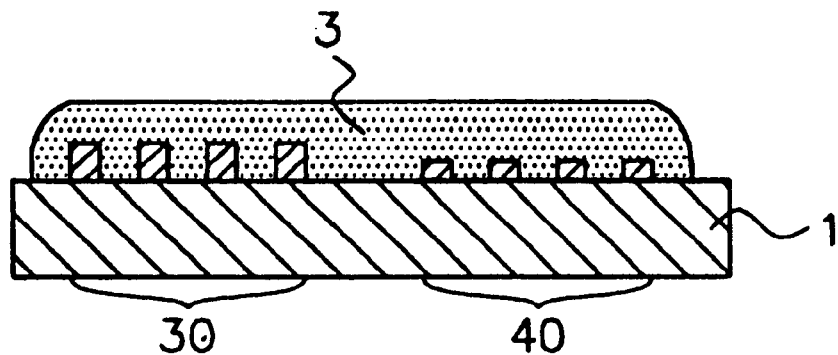
FIGS. 5A to 5D are schematic cross-sectional view showing a process for a surface acoustic wave device according to a third preferred embodiment of the present invention.

FIG. 5A shows the insulating film 3 similar to FIG. 3A except the frequency of the first surface acoustic wave element is lower than the desired value. That is, the film-thickness of the insulating film 3 of FIG. 5A is thicker than the insulating film 3 shown in FIG. 3A.

After the above-described insulating film 3 is applied, the frequency characteristic of the first surface acoustic wave element 30 is measured by wafer probing. The adjustment amount of the frequency characteristic is determined based on the measurement results.

Figure 5B:
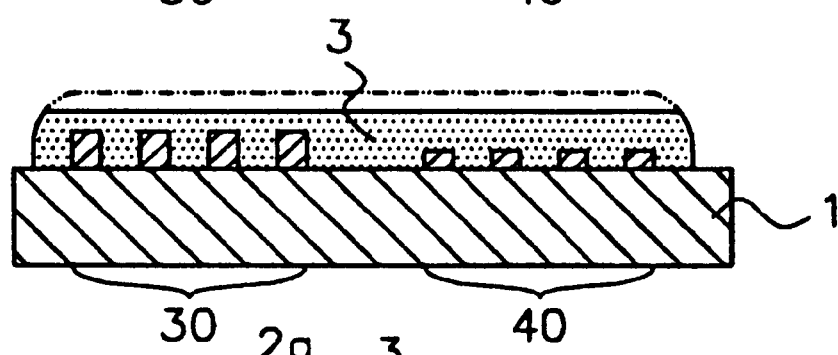

Further, as shown in FIG. 5B, the surface of the insulating film 3 is plasma-etched so that the frequency of the first surface acoustic wave element 30 has a desired value. The thickness of the insulating film 3 is set at a predetermined value so that the frequency characteristic of the first surface acoustic wave element 30 has this desired value.

Thereafter, the frequency characteristic of the second surface acoustic wave element 40 is measured by wafer probing, and the adjustment amount of the frequency characteristic is determined based on the measurement results.

Figure 5C:
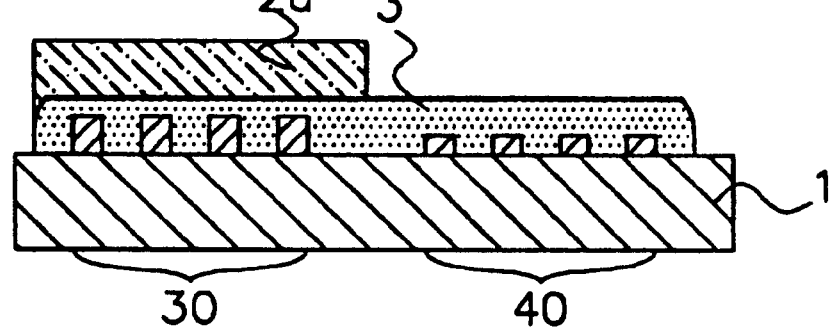

A positive resist is applied to the whole surface of the insulating film 3 shown in FIG. 5B. The resist is exposed through a mask having a shielding portion corresponding to the first surface acoustic wave element 30. Then, the exposed resist part is removed to obtain a patterned resist 2a shown in FIG. 5C.

Figure 5D:
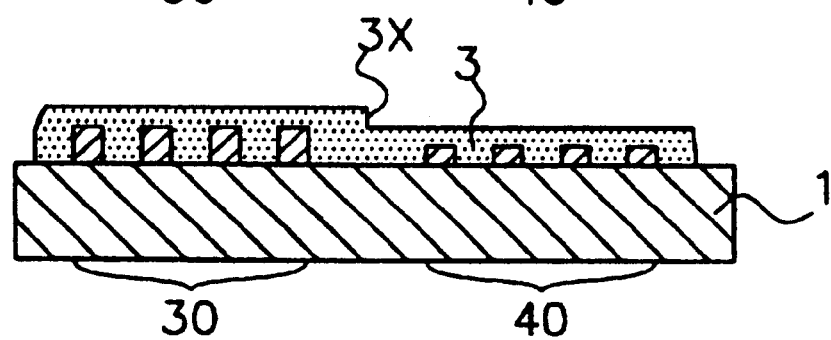
Figure 6A:
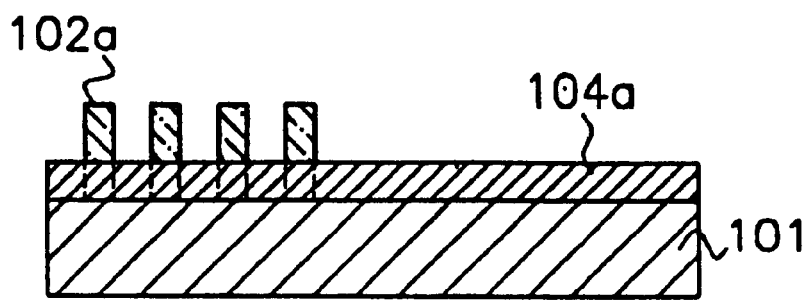
FIGS. 6A to 6E are schematic cross-sectional views showing a process for a conventional surface acoustic wave device.
Figure 6B:
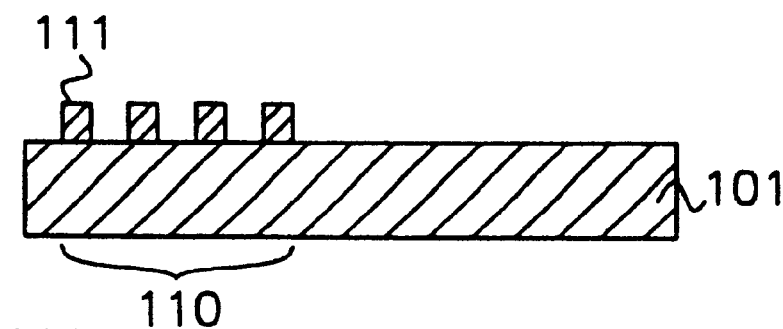
Figure 6C:
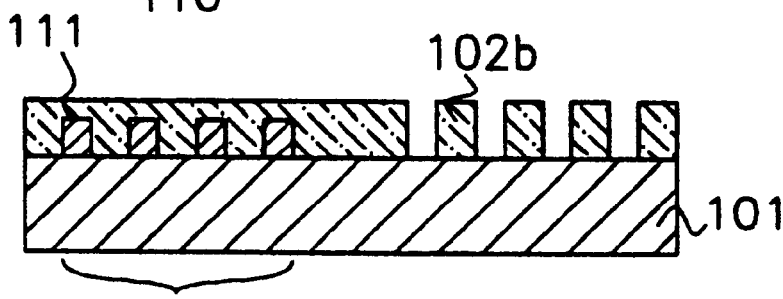
Figure 6D:
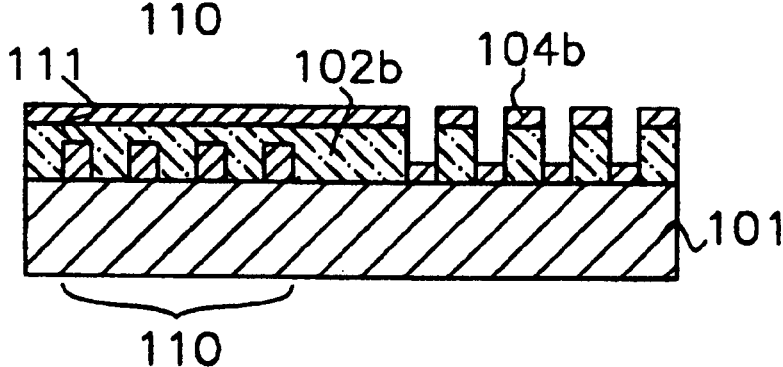
Figure 6E:
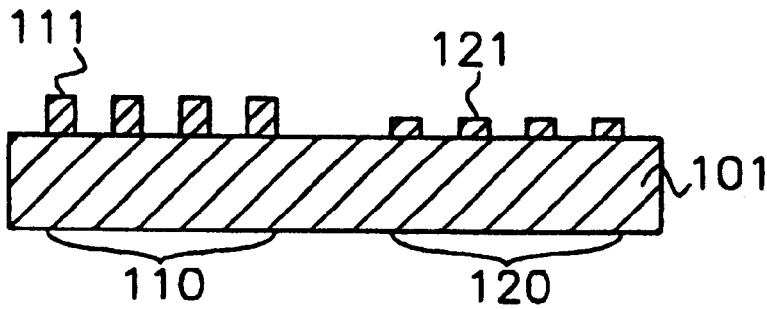

Next, etching is performed using an etchant which is capable of removing the insulating film 3 but not the resist 2a, and subsequently, a step 3X is produced on the insulating film 3 as shown in FIG. 5D. The etching may be of wet type or dry type using plasma or other suitable methods.

In this preferred embodiment, the number of defective composite elements is minimized by applying the $SiO_2$ film on the first and second surface acoustic wave elements. Since the $SiO_2$ film formed on the second surface acoustic wave element is adjusted after the $SiO_2$ film formed on the first surface acoustic wave element is adjusted, the frequencies of the two surface acoustic wave elements are effectively adjusted. The number of defective composite elements is minimized.

The technique in which the insulating films formed on the first and second surface acoustic wave elements are made different from each other so that the frequencies of the two different surface acoustic wave elements are effectively adjusted, as described in the second and third preferred embodiments, can be used for the one terminal pair resonator described in the first preferred embodiment. Particularly, the techniques described in the first to third preferred embodiments of the present invention can be applied to any suitable device, such as a resonator, a filter, a duplexer or other electronic component. The techniques can also be applied to surface acoustic wave elements having no reflectors.

In the above-described respective preferred embodiments, the thickness of the conductive film of the second surface acoustic wave element is preferably less than that of the conductive film of the first surface acoustic wave element. Conversely, the thickness of the conductive film of the second surface acoustic wave element may be greater than that of the conductive film of the first surface acoustic wave element.

The piezoelectric substrate in the respective preferred embodiments can be any suitable piezoelectric single crystals such as quartz, lithium tetraborate, and langasite, and any suitable piezoelectric ceramics such as lead titanate zirconate-type piezoelectric ceramic. Further, piezoelectric substrates having piezoelectric thin films made of ZnO or other suitable thin films, formed on insulation substrates made of alumina or other suitable insulation substrates may be used. As electrode material for the IDT, the reflectors, and other elements, any of Al, Al alloys, and other conductive materials can be applied for the present invention. Moreover, the insulating film for adjusting the frequency characteristic is not limited to $SiO_2$.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of producing a surface acoustic wave device having first and second surface acoustic wave elements provided on a piezoelectric substrate, comprising the steps of:

forming an interdigital transducer of the first surface acoustic wave element on the piezoelectric substrate, the interdigital transducer having input-output terminals electrically connected via a short-circuiting electrode;

providing a resist on the surface of the substrate where the interdigital transducer of the first surface acoustic wave element and the short-circuiting electrode are formed;

heating the resist;

removing the resist only from an area where the second surface acoustic wave element is to be formed;

applying a conductive film to the piezoelectric substrate, the conductive film having a thickness that is different from a thickness of the interdigital transducer of the first surface acoustic wave element;

patterning the conductive film to form an interdigital transducer of the second surface acoustic wave element;

cutting the short-circuiting electrode to electrically disconnect the input-output terminals of the interdigital transducer of the first surface acoustic wave element;

forming an insulating film on the interdigital transducers of the first and second surface acoustic wave elements; and decreasing the thickness of the insulating film to adjust frequency characteristics of at least one of the first and second surface acoustic wave elements.

2. A method of producing a surface acoustic wave device according to claim 1, wherein the step of patterning the conductive film is accomplished by a lift-off method.

3. A method of producing a surface acoustic wave device according to claim 1, further comprising the steps of measuring the frequency characteristics of the first and second surface acoustic wave elements by wafer probing prior to the step of adjusting the frequency.

4. A method of producing a surface acoustic wave device according to claim 1, wherein the step of decreasing the thickness of the insulating film is performed so that the thickness of the insulating film at a region on the interdigital transducer of the first surface acoustic wave element is different from the thickness of the insulating film at the region on the interdigital transducer of the second surface acoustic wave element.

5. A method of producing a surface acoustic wave device according to claim 4, wherein the step of decreasing the thickness of the insulating film includes the steps of decreasing the thickness of the entire insulating film such that one of the first and second surface acoustic wave elements has a desired frequency characteristic, measuring frequency characteristics of the other of the first and second surface acoustic wave elements to determine the desired thickness of the insulating film for the other of the first and second surface acoustic wave elements to achieve desired frequency characteristics, and decreasing the thickness of the insulating film only on a region of the other of the first and second surface acoustic wave elements to have a desired frequency characteristic based on the desired thickness determined by the measuring step.

6. A method of producing a surface acoustic wave device according to claim 5, wherein the step of patterning the conductive film is accomplished by a lift-off method.

7. A method of producing a surface acoustic wave device according to claim 5, further comprising the steps of measuring the frequency characteristics of the first and second surface acoustic wave elements by wafer probing prior to the step of adjusting the frequency.

8. A method of producing a surface acoustic wave device according to claim 5, wherein the step of decreasing the thickness of the insulating film is performed so that the thickness of the insulating film at a region on the interdigital transducer of the first surface acoustic wave element is different from the thickness of the insulating film at the region on the interdigital transducer of the second surface acoustic wave element.

9. A method of producing a surface acoustic wave device according to claim 5, wherein the insulating film formed by the insulating film forming step has a predetermined thickness such that one of the first and second surface acoustic wave elements has a desired frequency characteristic, and the step of decreasing the thickness of the insulating film is performed to etch only a region of the interdigital transducer of the other of the first and second surface acoustic wave elements.

10. A method of producing a surface acoustic wave device according to claim 1, wherein the insulating film formed by the insulating film forming step has a predetermined thickness such that one of the first and second surface acoustic wave elements has a desired frequency characteristic, and the step of decreasing the thickness of the insulating film is performed to etch only a region of the interdigital transducer of the other of the first and second surface acoustic wave elements.

11. A method of producing a surface acoustic wave device in which first and second surface acoustic wave elements are formed on a piezoelectric substrate, comprising the steps of:

forming an interdigital transducer of the first surface acoustic wave element on the piezoelectric substrate;

forming an interdigital transducer of the second surface acoustic wave element on the piezoelectric substrate;

coating said interdigital transducers of said first and second surface acoustic wave elements with an insulating film; and decreasing the thickness of the insulating film to adjust the frequency characteristics of at least one of the first and second surface acoustic wave elements such that the second surface acoustic wave element has a frequency characteristic that is different from that of the first surface acoustic wave element.

12. A method of producing a surface acoustic wave device according to claim 11, wherein the insulating film formed by the insulating film coating step has a predetermined thickness such that one of the first and second surface acoustic wave elements has a desired frequency characteristic, and the step of decreasing the thickness of the insulating film is performed to etch only a portion of the insulating film in a region of the interdigital transducer of the other of the first and second surface acoustic wave elements.

13. A method of producing a surface acoustic wave device according to claim 11, wherein the step of decreasing the thickness of the insulating film includes the steps of decreasing the thickness of an entirety of the insulating film such that one of the first and second surface acoustic wave elements has a desired frequency characteristic, measuring frequency characteristics of the other of the first and second surface acoustic wave elements to determine the desired thickness of the insulating film for the other of the first and second surface acoustic wave elements to achieve a desired frequency characteristic, and decreasing the thickness of the insulating film only on a region of the other of the first and second surface acoustic wave elements to have a desired frequency characteristic based on the desired thickness determined by the measuring step.

14. A method of producing a surface acoustic wave device according to claim 11, wherein the interdigital transducer of the first surface acoustic wave element has input-output terminals which are electrically connected via a short-circuiting electrode, and the step of forming the interdigital transducer of the first surface acoustic wave element includes the steps of forming a resist on an entire surface of the substrate where the interdigital transducer of the first surface acoustic wave element and the short-circuiting electrode are formed, heating the resist, removing the resist only from the area where the second surface acoustic wave element is to be formed, and applying a conductive film to the piezoelectric substrate, the conductive film having a thickness that is different from a thickness of the interdigital transducer of the first surface acoustic wave element.

15. A method of producing a surface acoustic wave device according to claim 14, further including the steps of applying a conductive film on the piezoelectric substrate, the conductive film having a thickness that is different from a thickness of the interdigital transducer of the first surface acoustic wave element, patterning the conductive film to form an interdigital transducer of the second surface acoustic wave element, cutting the short-circuiting electrode to electrically disconnect the input-output terminals of the interdigital transducer of the first surface acoustic wave element, forming an insulating film on the interdigital transducers of the first and second surface acoustic wave elements, and decreasing the thickness of the insulating film to adjust frequency characteristics of at least one of the first and second surface acoustic wave elements.

* * * * *